(12) United States Patent
Groothuis et al.

(10) Patent No.: US 9,899,293 B2
(45) Date of Patent: *Feb. 20, 2018

(54) SEMICONDUCTOR DEVICE PACKAGES WITH IMPROVED THERMAL MANAGEMENT AND RELATED METHODS

(71) Applicant: Micron Technology, Inc., Boise, ID (US)

(72) Inventors: Steven Groothuis, Boise, ID (US); Jian Li, Boise, ID (US); Shijian Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/401,762

(22) Filed: Jan. 9, 2017

(65) Prior Publication Data

US 2017/0117205 A1    Apr. 27, 2017

Related U.S. Application Data

(63) Continuation of application No. 14/605,466, filed on Jan. 26, 2015, now Pat. No. 9,543,274.

(51) Int. Cl.
| | |
|---|---|
| *H01L 21/00* | (2006.01) |
| *H01L 21/44* | (2006.01) |
| *H01L 23/367* | (2006.01) |
| *H01L 25/065* | (2006.01) |
| *H01L 21/56* | (2006.01) |
| *H01L 23/48* | (2006.01) |
| *H01L 21/48* | (2006.01) |

(52) U.S. Cl.
CPC ...... *H01L 23/3675* (2013.01); *H01L 21/4882* (2013.01); *H01L 21/563* (2013.01); *H01L 23/481* (2013.01); *H01L 25/0657* (2013.01); *H01L 2225/06513* (2013.01); *H01L 2225/06541* (2013.01); *H01L 2225/06589* (2013.01)

(58) Field of Classification Search
CPC .......................... H01L 21/563; H01L 25/0657
USPC .................................. 438/107–109; 257/686
See application file for complete search history.

(56) References Cited

U.S. PATENT DOCUMENTS

| | | | |
|---|---|---|---|
| 7,119,428 B2 | 10/2006 | Tanie et al. | |
| 7,960,843 B2 * | 6/2011 | Hedler ................ | H01L 23/5385 257/774 |
| 8,415,788 B2 | 4/2013 | Li et al. | |
| 9,153,520 B2 | 10/2015 | Groothuis et al. | |
| 9,543,274 B2 * | 1/2017 | Groothuis ............... | H01L 23/13 438/109 |

(Continued)

*Primary Examiner* — Calvin Lee
(74) *Attorney, Agent, or Firm* — TraskBritt

(57) ABSTRACT

Semiconductor device packages in accordance with this disclosure may include a substrate and a stack of semiconductor dice attached to the substrate. An uppermost semiconductor die of the stack of semiconductor dice located on a side of the stack of semiconductor dice opposite the substrate may be a heat-generating component configured to generate more heat than each other semiconductor die of the stack of semiconductor dice. Electrical connectors may extend directly from the uppermost semiconductor die to the substrate. A heat sink may be located on a side of the uppermost semiconductor die opposite the substrate. A passivation material may be located between the uppermost semiconductor die and the heat sink.

20 Claims, 5 Drawing Sheets

(56) References Cited

U.S. PATENT DOCUMENTS

2006/0289981 A1    12/2006   Nickerson et al.
2007/0023887 A1    2/2007   Matsui
2013/0119527 A1    5/2013   Luo et al.
2013/0119528 A1    5/2013   Groothuis et al.
2014/0015598 A1    1/2014   Groothuis et al.

* cited by examiner

SEMICONDUCTOR DEVICE PACKAGES WITH IMPROVED THERMAL MANAGEMENT AND RELATED METHODS

CROSS-REFERENCE TO RELATED APPLICATION

This application is a continuation of U.S. patent application Ser. No. 14/605,466, filed Jan. 26, 2015, now U.S. Pat. No. 9,543,274 issued Jan. 10, 2017, the disclosure of which is hereby incorporated herein in its entirety by this reference.

FIELD

This disclosure relates generally to semiconductor device packages and methods of packaging semiconductor devices. More specifically, disclosed embodiments relate to semiconductor device packages and methods of packaging semiconductor devices that may improve thermal management of the semiconductor device packages.

BACKGROUND

When in use, some semiconductor devices generate significant quantities of heat. Thermal management techniques may be employed to conduct heat away from such semiconductor devices and other components near such semiconductor devices. For example, U.S. Patent Application Pub. No. 2014/0015598, published Jan. 14, 2014 and titled "SEMICONDUCTOR DEVICE PACKAGES INCLUDING THERMALLY INSULATING MATERIALS AND METHODS OF MAKING AND USING SUCH SEMICONDUCTOR PACKAGES" discloses that a thermally insulating material may be positioned on peripheries of dice in a die stack to alter the path of least resistance for heat transfer from a heat-generating region of a base die extending laterally beyond the thermally insulating material on a lowest die in the stack. When thermal management techniques used to conduct heat away from heat generating semiconductor devices are inadequate, the resulting temperatures may degrade performance of such semiconductor devices, may degrade performance of other components near such semiconductor devices, may damage such semiconductor devices, may damage other components near such semiconductor devices, and may even injure a user near that semiconductor device.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device package or component thereof, but are merely idealized representations employed to describe illustrative embodiments. Thus, the drawings are not necessarily to scale.

Disclosed embodiments relate generally to semiconductor device packages and methods of packaging semiconductor devices that may improve thermal management of the semiconductor device packages. More specifically, disclosed are embodiments of semiconductor device packages wherein a semiconductor die configured to generate the most heat in a stack of semiconductor dice may be located at a top of the stack and the topmost semiconductor die may be directly electrically connected to the package substrate.

Figure 1:
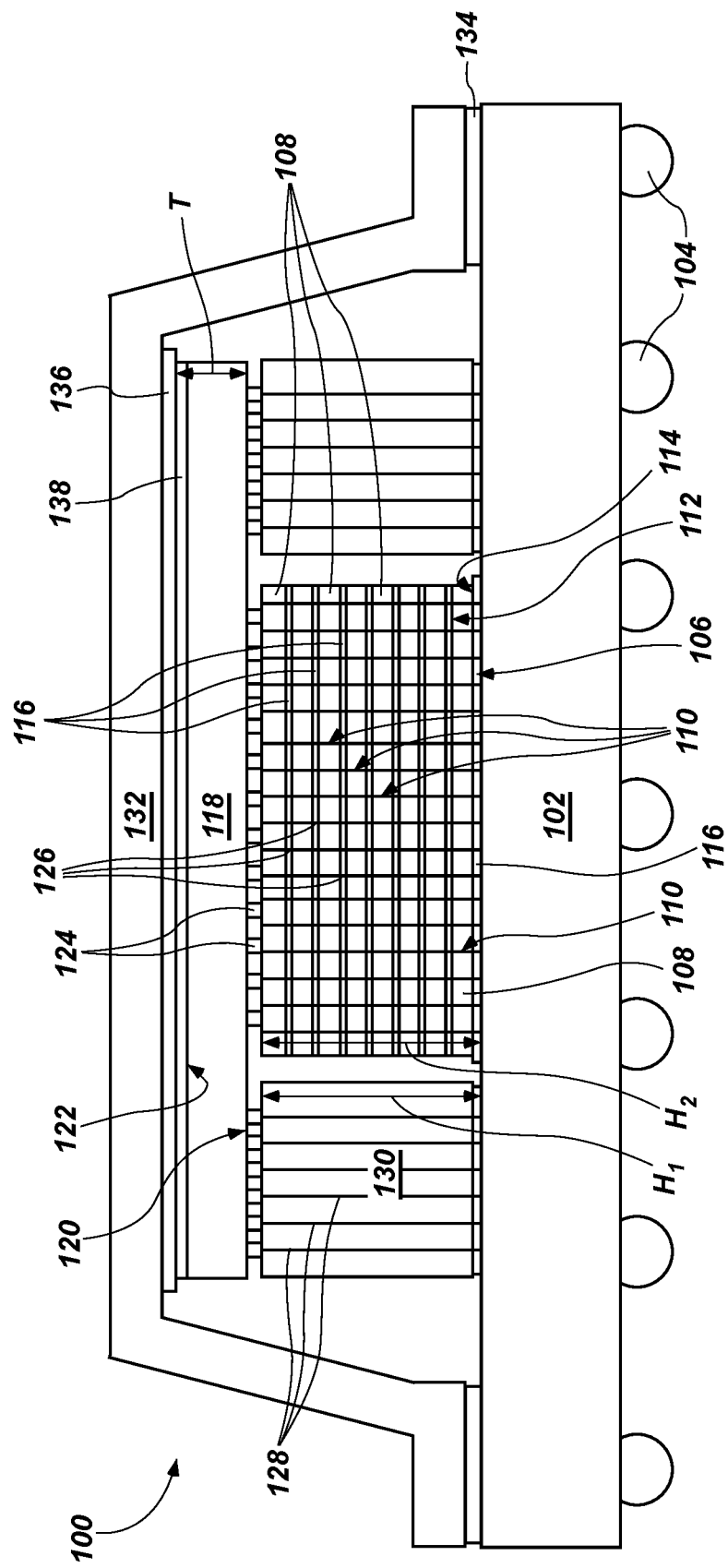
FIG. 1 is a cross-sectional view of a semiconductor device package.

Referring to FIG. 1, a cross-sectional view of a semiconductor device package 100 is shown. The semiconductor device package 100 may include a substrate 102. The substrate 102 may include electrically conductive elements 104, such as, for example, bumps, balls, studs, or posts of electrically conductive material (e.g., solder), configured to electrically connect the semiconductor device package 100 to another structure. The conductive elements 104 may be located, for example, on a bottom surface of the semiconductor device package 100, protruding from a surface of substrate 102. The substrate 102 may include conductive pads 106 on a surface of the substrate 102 opposing the conductive elements 104. The conductive pads 106 may be of an electrically conductive material (e.g., copper) and may be positioned and configured to form electrical connections with an overlying structure. The substrate 102 may include circuitry to electrically connect the conductive pads 106 to the conductive elements 104, which circuitry may extend through a thickness of the substrate 102. The substrate 102 may be, for example, a printed circuit board, a ceramic, or a substrate of semiconductor material.

The semiconductor device package 100 may further include a stack of semiconductor dice 108 attached and electrically connected to the substrate 102. In some embodiments, the semiconductor dice 108 may be memory dice, such as, for example, dynamic random access memory (DRAM) dice. A total number of additional semiconductor dice 108 in the stack may be, for example, three, five, seven, eleven, fifteen, or more.

Each semiconductor die 108 may comprise conductive vias 110 extending through a thickness of the semiconductor die 108 to establish electrical connections between the semiconductor dice 108 and the conductive pads 106 of the substrate 102. More specifically, each semiconductor die 108 may include a plurality of conductive vias 110 (e.g., a matrix of vias 110) extending through a thickness thereof to provide electrical connections between an active surface 112 of each semiconductor die 108 and an opposing inactive surface 114 (e.g., a back side surface) thereof. The active surfaces 112 of the semiconductor dice 108 may be located on a side of each respective semiconductor die 108 opposing the substrate 102, and the conductive vias 110 may electrically connect semiconductor dice 108 to one another and to the substrate 102 through aligned conductive pillars 126. Each conductive via 110 may include, for example, a hole extending through the respective semiconductor die 108, an electrically conductive material located within the hole, and a passivation material lining a sidewall defining the hole to electrically isolate the conductive material from the surrounding semiconductor material of the semiconductor die 108.

A dielectric underfill material 116 (e.g., capillary underfill, nonconductive paste, or wafer-level underfill) may be located between the semiconductor dice 108 and between the lowermost semiconductor die 108 of the stack and the substrate 102 in some embodiments. More specifically, underfill material 116 may be located between, and in contact with, the semiconductor dice 108 of the stack and between the lowermost semiconductor die 108 and the substrate 102, the underfill surrounding the conductive pillars 126. Suitable underfill materials 116 are commercially available, for example, from Sumitomo Plastics America, Inc. of Santa Clara, Calif.

The semiconductor device package 100 may include another semiconductor die 118 electrically connected to the stack of semiconductor dice 108 and located on a side of the stack of semiconductor dice 108 opposing the substrate 102. The other semiconductor die 118 may be configured to generate more heat when in use than each semiconductor die 108 located in the stack between the other semiconductor die 118 and the substrate 102. For example, the other semiconductor die 118 may be configured to generate more heat when in use than any other component of the semiconductor device package 100. More specifically, the other semiconductor die 118 may include, for example, logic circuitry (e.g., may be a logic die), which may cause the other semiconductor die 118 to generate the most heat of any component of the semiconductor device package 100. As a specific, nonlimiting example, the other semiconductor die 118 may be a logic die including a high-power serializer/deserializer (e.g., a SERDES) and, in some embodiments, other high-power integrated circuitry (for example, a system-on-a-chip), which may cause the other semiconductor die 118 to generate the most heat of any active component of the semiconductor device package 100.

The other semiconductor die 118 may be a heat-generating component located farthest from the substrate 102 when compared to each other heat-generating component in the semiconductor device package 100. For example, the other semiconductor die 118 may be a heat-generating component located nearest any heat dissipation structures utilized in connection with the semiconductor device package 100. More specifically, the other semiconductor die 118 may be, for example, the topmost die in a stack of semiconductor dice including the aforementioned semiconductor dice 108 in the stack and the other semiconductor die 118.

When fabricating semiconductor device packages, such as those shown in FIGS. 4A and 4B in U.S. Patent Application Pub. No. 2014/0015598 in which the heat-generating component configured to generate the most heat during operation is not located distant from the substrate (e.g., where the logic die is located adjacent to the substrate and a stack of memory dice is located on the opposite side of the logic die), the real-world steady-state operational temperatures reached by dice within such packages may not match those predicted using simulation techniques (e.g., finite element analysis). Unexpectedly high temperatures may exceed the recommended operating temperatures of the components of the packages, which may degrade performance, damage the components, or even cause the packages to fail. More specifically, the logic die may be heated to temperatures exceeding 105° C. and one or more of the memory dice may be heated to temperatures exceeding 95° C. by about 20° C. or more, with a temperature differential between the logic die and the top of the stack of memory dice being on the order of 40° C.

By positioning the other semiconductor die 118 farther from the substrate 102 than other heat-generating components in the semiconductor device package 100, heat generated by the other semiconductor die 118 may be more easily dissipated and otherwise managed. For example, a resulting operational temperature of at least some components of the semiconductor device package 100 may be 10° C. or more cooler than a resulting operational temperature of similar components in embodiments where the other semiconductor die 118 is located closer to the substrate 102 (e.g., adjacent to the substrate 102, at a bottom of a semiconductor die stack), which may cause the actual operational temperatures reached by the semiconductor dice 108 in the stack and the other semiconductor die 118 to remain at or below recommended maximum operating temperatures for the semiconductor dice 108 in the stack and the other semiconductor die 118. More specifically, the resulting operational temperature of at least some components of the semiconductor device package 100 may be, for example, at least 20° C. cooler than a resulting temperature of similar components in embodiments where the other semiconductor die 118 is located closer to the substrate 102, and temperature differential between the other semiconductor die 118 and the exterior of an overlying heat spreader 132 (FIG. 1) may be only about 20° C. Such reductions in temperatures may maintain the actual operational temperatures of the semiconductor (memory) dice 108 in the stack at or below 95° C., and may maintain the actual temperature of the other (logic) semiconductor die 118 at or below 105° C., which temperature reduction may maintain quality of performance, reduce the likelihood of temperature damage being inflicted on the components, and reduce the failure rate of the packages 100.

In some embodiments, the other semiconductor die 118 may be free of vias 110. For example, an active surface 120 of the other semiconductor die 118 may be located on the side of the other semiconductor die 118 facing an adjacent semiconductor die 108 in the stack, enabling electrical connection of integrated circuitry of the active surface 120 to the adjacent semiconductor die 108 in the stack without requiring the electrical connections to extend through the other semiconductor die 118. More specifically, the active surface 120 of the other semiconductor die 118 may face the substrate 102, an inactive surface 122 of the other semiconductor die 118 may be located on a side of the other semiconductor die 118 opposing the substrate 102, and electrical conductors 124 (e.g., conductive bumps, pillars, balls, studs, etc.) may electrically connect the other semiconductor die 118 to the adjacent semiconductor die 108 in the stack without passing through the other semiconductor die 118. When the other semiconductor die 118 lacks vias, a wider variety of architectures for the integrated circuitry of the other semiconductor die 118 may be available. For example, the integrated circuitry of the active surface 120 of the other semiconductor die 118 may not be limited to a 32-micron architecture because it need not be connected to any vias 110.

In some embodiments, a thickness T of the other semiconductor die 118 may not be thinned subsequent to formation of the integrated circuitry on the active surface of the other semiconductor die. For example, the thickness T of the other semiconductor die 118 in a direction perpendicular to the active surface 120 of the other semiconductor die 118 may approach, or even be equal to the thickness T of a wafer from which the other semiconductor die 118 was singulated.

More specifically, the thickness T of the other semiconductor die 118 may be about 200 microns or greater. As a specific, nonlimiting example, the thickness T of the other semiconductor die 118 may be about 300 microns, about 400 microns, or greater. Leaving the other semiconductor die 118 at full thickness T may render the other semiconductor die 118, and the semiconductor device package 100 of which it is a part, mechanically stronger and stiffer. In other embodiments, however, for example, when height of the semiconductor package 100 may be an issue, the thickness T of the other semiconductor die 118 may be thinned relative to the wafer from which the other semiconductor die 118 was singulated. More specifically, the thickness T of the other semiconductor die 118 may be, for example, about 100 microns or less. As a specific, nonlimiting example, the thickness T of the other semiconductor die 118 may be about 50 microns or less (e.g., about 25 microns).

In some embodiments, the semiconductor device package 100 may lack any encapsulation material located on the side of the other semiconductor die 118 opposing the first semiconductor die 108. For example, the inactive surface 122 of the other semiconductor die 118 may be free of (e.g., may not be in contact with) encapsulation material. More specifically, the other semiconductor die 118 may be, for example, unencapsulated, such that encapsulation material does not contact any surface of the other semiconductor die 118. In some embodiments, the semiconductor device package 100 may be free of underfill material 116 between the other semiconductor die 118 and the adjacent semiconductor die 108 in the stack. In other embodiments, underfill material 116 may be located between the other semiconductor die 118 and the adjacent semiconductor die 108 and surrounding the electrical conductors 124.

The semiconductor device package 100 may include one or more electrical connectors 128 located peripherally adjacent to the vias 110 of semiconductor dice 108 and directly electrically connecting the other semiconductor die 118 to the substrate 102. For example, the semiconductor device package 100 may include high-speed electrical connectors 128 located laterally adjacent to the stack of semiconductor dice 108 between the other semiconductor die 118 and the substrate 102 in the stack and extending from the active surface 120 of the other semiconductor die 118 to the conductive pads 106 of the substrate 102. More specifically, the semiconductor device package 100 may include high-speed electrical connectors 128 which may not include direct electrical connections to the integrated circuitry of the semiconductor dice 108 of the stack between the other semiconductor die 118 and the substrate 102 extending from the active surface 120 of the other semiconductor die 118 to the conductive pads 106 of the substrate 102 to directly electrically connect the other semiconductor die 118 to the substrate 102. The electrical connectors 128 may include, for example, an electrically conductive material (e.g., copper, aluminum, gold, or silver) extending through a material exhibiting high thermal conductivity (e.g., a thermal conductivity of about 1.5 W/m·K, 15 W/m·K, 100 W/m·K, 150 W/m·K or more) or low thermal conductivity (e.g., a thermal conductivity of about 1 W/m·K or less).

In some embodiments, the electrical connectors 128 may extend through one or more interposers 130 located between the other semiconductor die 118 and the substrate 102. For example, the electrical connectors 128 may constitute conductive vias extending through one or more interposers 130 located laterally adjacent to the stack of semiconductor dice 108 between the other semiconductor die 118 and the substrate 102, which conductive vias may each include a high-aspect ratio aperture extending through the interposer 120, an electrically conductive material (e.g., copper) located within the aperture, and a passivation material lining a sidewall defining the hole to electrically isolate the conductive material from the surrounding material of the interposer 130. A height $H_1$ of the interposer 130 above the substrate 102 may be at least substantially equal to a combined height $H_2$ of the stack of semiconductor dice 108 between the other semiconductor die 118 and the substrate 102. The interposer 130 may be, for example, a printed circuit board (PCB), a liquid crystal polymer (LCP), or a mass of silicon (e.g., a silicon window) through which the electrical connectors 128 extend. If the interposer 130 is formed of an electrically conductive material, the electrical connectors 128 may be electrically isolated from the electrically conductive material by a surrounding passivation layer in each aperture.

In embodiments where the electrical connectors 128 extend through one or more interposers 130, a surface area of the active surface 120 of the other semiconductor die 118 may be greater than a surface area of the active surfaces of the stack of semiconductor dice 108 located between the semiconductor die 118 and the substrate 102. In other words, at least one dimension of the other semiconductor die 118 may be greater than a corresponding dimension of the semiconductor dice 108 in the stack, such that the other semiconductor die 118 overhangs the stack. More specifically, the substrate 102 and the other semiconductor die 118 may be, for example, larger in at least one lateral dimension than the semiconductor dice 108 in the stack between the semiconductor die 118 and the substrate 102, and the electrical connectors 128 may extend through at least one interposer 130 located adjacent to the stack of semiconductor dice 108 between at least one portion of each of the substrate 102 and the other semiconductor die 118 extending laterally beyond at least one side of the stack of semiconductor dice 108. As a specific, nonlimiting example, the substrate 102 and the other semiconductor die 118 may be larger in length and width than a length and width of semiconductor dice 108 in the stack between the semiconductor die 118 and the substrate 102, and the interposer 130 may peripherally surround the stack of semiconductor dice 108 between the substrate 102 and the other semiconductor die 118 between a portion of each of the substrate 102 and the other semiconductor die 118 extending laterally beyond sides of the stack of semiconductor dice 108.

Figure 2:
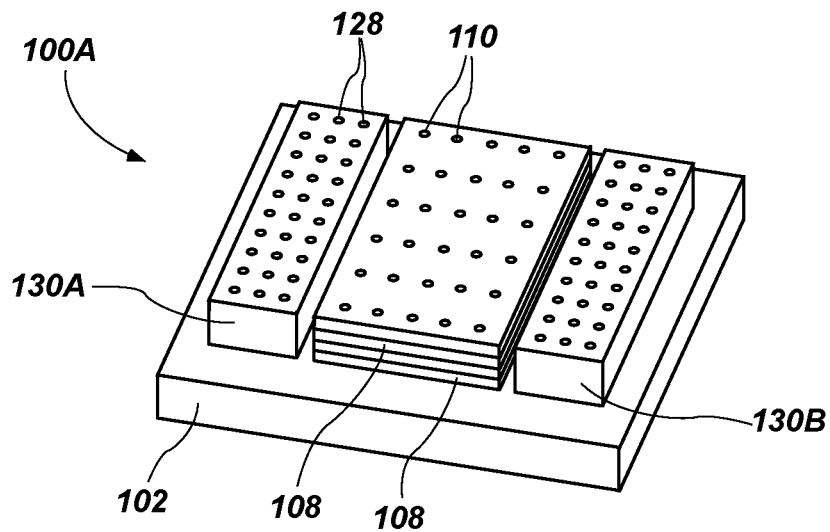
FIG. 2 is a perspective view of one embodiment of a portion of the semiconductor device package of FIG. 1.

FIG. 2 is a perspective view of one embodiment of a portion 100A of the semiconductor device package 100 of FIG. 1. In some embodiments, the semiconductor device package 100 (see FIG. 1) may include two or more interposers 130A and 130B located laterally adjacent to the stack of semiconductor dice 108 between the other semiconductor die 118 (see FIG. 1) and the substrate 102. For example, two interposers 130A and 130B may laterally flank the semiconductor dice 108 in the stack between the other semiconductor die 118 (see FIG. 1) and the substrate 102. More specifically, the interposers 130A and 130B may extend along a length of the stack of semiconductor dice 108 between the other semiconductor die 118 (see FIG. 1) and the substrate 102 on two opposing sides of the semiconductor dice 108. As a specific, nonlimiting example, two interposers 130A and 130B in the form of strips may be of at least substantially equal length as the stack of semiconductor dice 108 between the other semiconductor die 118 (see FIG. 1) and the substrate 102 may be located on the two opposing sides of the semiconductor dice 108. In other embodiments, two or more interposers may be located laterally adjacent to the semiconductor dice 108 in the stack between the other semiconductor die 118 (see FIG. 1) and the substrate 102 on a single side of the semiconductor dice 108 or on two adjacent sides of the semiconductor dice 108.

Figure 3:
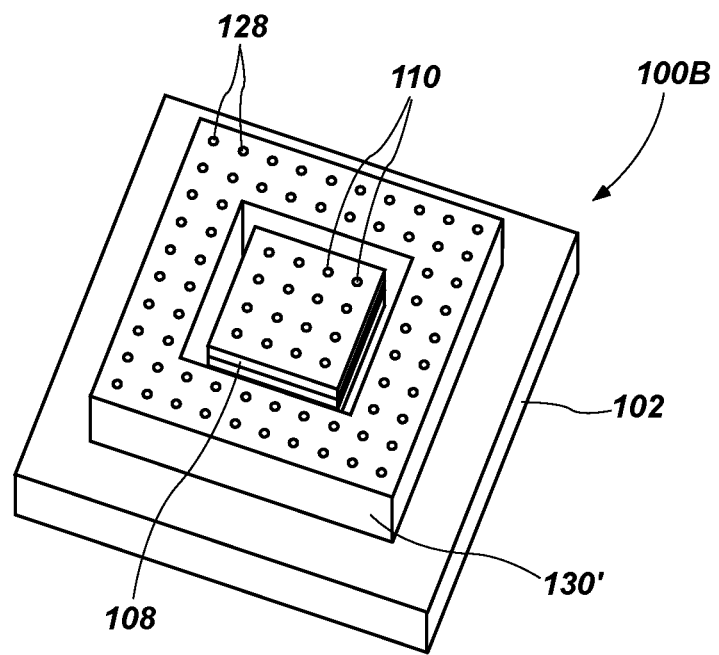
FIG. 3 is a perspective view of another embodiment of the portion of the semiconductor device package of FIG. 1.

FIG. 3 is a perspective view of another embodiment of a portion 100B of the semiconductor device package 100 of FIG. 1. In other embodiments, the semiconductor device package 100 (see FIG. 1) may include one interposer 130' located laterally adjacent to the stack of semiconductor dice 108 between the other semiconductor die 118 (see FIG. 1) and the substrate 102. For example, a single interposer 130' may laterally surround the stack of semiconductor dice 108 between the other semiconductor die 118 (see FIG. 1) and the substrate 102. More specifically, the interposer 130' may be configured as a frame and extend entirely around the stack of semiconductor dice 108 between the other semiconductor die 118 (see FIG. 1) and the substrate 102 on four sides of the semiconductor dice 108. In other examples, one interposer 130' may extend along one side, two adjoining sides, or three sides of the stack of semiconductor dice 108 between the other semiconductor die 118 (see FIG. 1) and the substrate 102.

Returning to FIG. 1, the semiconductor device package 100 may include a heat spreader 132 in some embodiments. For example, the heat spreader 132 may be located on a side of the other semiconductor die 118 opposing the substrate 102, and may be in thermal communication with the other semiconductor die 118. More specifically, the heat spreader 132 may extend over the inactive surface 122 of the other semiconductor die 118, down past the peripheries of the stack of semiconductor dice 108 between the other semiconductor die 118 and the substrate 102, and the interposer 130, and be attached to the substrate 102 (e.g., using an adhesive material 134). The heat spreader 132 may be of a thermally conductive material, such as, for example, copper, silicon carbide, aluminum, gold, or a thermally conductive alloy.

In some embodiments, a thermal interface material 136 (TIM) may be located between the other semiconductor die 118 and the heat spreader 132. The TIM 136 may be a thermally conductive material configured to facilitate heat transfer from the other semiconductor die 118 to the heat spreader 132. In some embodiments, the TIM 136 may be an electrically conductive material, which may enable the TIM 136 to exhibit a higher thermal conductivity than an electrically insulating TIM. Utilizing a topmost, other semiconductor die 118 free of vias may enable use of an electrically conductive TIM 136 because there may not be any electrical connectors (e.g., vias) on the inactive surface 122 of the other semiconductor die 118 that may be undesirably electrically interconnected by the electrically conductive TIM 136. In other embodiments, the TIM 136 may be an electrically insulating material. A thermal conductivity of the TIM 136 may be, for example, greater than about 1.2 W/m·K. More specifically, the thermal conductivity of the TIM 136 may be, for example, between about 2 W/m·K and about 200 W/m·K (e.g., about 3.2 W/m·K). The TIM 136 may be, for example, a thermal gel (e.g., a silicone-based curable gel), a thermal adhesive, a thermal grease, a phase change material (e.g., a phase change metal alloy), a solder, or a carbon nanotube material. In still other embodiments, the semiconductor device package 100 may lack any TIM, and the heat spreader 132 may directly contact the inactive surface 122 of the other semiconductor die 118.

In some embodiments, a passivation material 138 may be located between the heat spreader 132 and the other semiconductor die 118. For example, a passivation material 138 may be located between the other semiconductor die 118 and the TIM 136, which may be located between the passivation material 138 and the heat spreader 132. The passivation material 138 may be an electrically insulating material, and may reduce the likelihood that metal material from the heat spreader 132, the TIM 136, or both will diffuse into and contaminate semiconductor material of the other semiconductor die 118.

In other words, semiconductor device packages in accordance with this disclosure may include a substrate and a stack of semiconductor dice attached to the substrate. The stack of semiconductor dice may include vias extending through each semiconductor die of the stack for electrically interconnecting the semiconductor dice in the stack to one another and to the substrate. Another semiconductor die may be electrically connected to the stack of semiconductor dice and may be located on a side of the stack of semiconductor dice opposing the substrate. The other semiconductor die may be a heat-generating component configured to generate more heat than each semiconductor die of the stack of semiconductor dice. Electrical connectors may be located laterally adjacent to the vias and may form electrical connections between the substrate and the other semiconductor die in isolation from integrated circuitry of the semiconductor dice in the stack.

The semiconductor device package 100 may be assembled generally from the substrate 102 upward in some embodiments. For example, the stack of semiconductor dice 108 may be positioned on and electrically connected to the conductive pads 106 of the substrate 102 utilizing the vias 110 and the conductive pillars 126. The underfill material 116 may be positioned between each adjacent pair of semiconductor dice 108 and the substrate 102 one layer at a time, or in one step after the stack of semiconductor dice 108 is in place. Each interposer 130 may be positioned laterally adjacent to the stack of semiconductor dice 108 on the substrate 102, and may be electrically connected to the conductive pads 106 of the substrate 102 utilizing the electrical connectors 128. The other semiconductor die 118 may be positioned over, and electrically connected to, the electrical connectors 128 of each interposer 130 and the stack of semiconductor dice 108 with the active surface 120 of the other semiconductor die 118 facing the substrate 102. A passivation material 138 may be positioned on the inactive surface 122 of the other semiconductor die 118. A TIM 136 may be positioned on the passivation material 138 on a side opposing the other semiconductor die 118. Finally, a heat spreader 132 may be positioned on the TIM 136 and may be secured to the substrate 102 at a periphery of the substrate 102 using an adhesive material 134.

In other embodiments, the semiconductor device package 100 may be generally assembled from the other semiconductor die 118 downward (referring to the orientation as depicted in FIG. 1. For example, the other semiconductor die 118 may be positioned with its active surface 120 facing upward (e.g., may be flipped), and the topmost next semiconductor die 108 in the stack may be positioned on, and electrically connected to, the active surface 120 of the other semiconductor die 118 utilizing the electrical conductors 124 and the vias 110. The rest of the semiconductor dice 108 may be stacked on, and electrically connected to, the next semiconductor die 108 to form a stack on the other semiconductor die 118. Such assembly may be effected with an array of unsingulated other semiconductor dice 118 at the wafer level, and the resulting assembly singulated thereafter. Each interposer 130 may be positioned laterally adjacent to the semiconductor dice 108 on the other semiconductor die 118, and the electrical connectors 128 of each interposer 130 may be electrically connected to the other semiconductor die 118 utilizing the electrical conductors 124. The other semiconductor die 118, the stack of semiconductor dice 108, and each interposer 130 may be inverted such that the active surface 120 of the other semiconductor die 118 faces the substrate 102 and may be positioned over, and electrically connected to, the conductive pads 106 of the substrate 102. The underfill material 116 may be positioned between the other semiconductor die 118 and the adjacent semiconductor die 108 as well as between each adjacent pair of semiconductor dice 108 one layer at a time, or in one step after disposition on the other semiconductor die 118. A passivation material 138 may be positioned on the inactive surface 122 of the other semiconductor die 118 at the wafer level, if desirable. A TIM 136 may be positioned on the passivation material 138 on a side opposing the other semiconductor die 118. Finally, a heat sink in the form of, for example, heat spreader 132 may be positioned on the TIM 136 and may be secured to the substrate 102 at a periphery of the substrate 102 using an adhesive material 134.

In other words, methods of making semiconductor device packages in accordance with this disclosure may involve attaching a stack of semiconductor dice to a substrate, the stack of semiconductor dice comprising vias extending through each semiconductor die of the stack for electrically interconnecting the semiconductor dice in the stack to one another and to the substrate. Another semiconductor die may be positioned on a side of the stack of semiconductor dice opposing the substrate and may be electrically connected to the first semiconductor die. The other semiconductor die may be a heat-generating component configured to generate more heat than each semiconductor die of the stack of semiconductor dice. A direct electrical connection may be formed between the substrate and the other semiconductor die in electrical isolation from integrated circuitry of the semiconductor dice of the stack utilizing electrical connectors located laterally adjacent to the vias.

Figure 4:
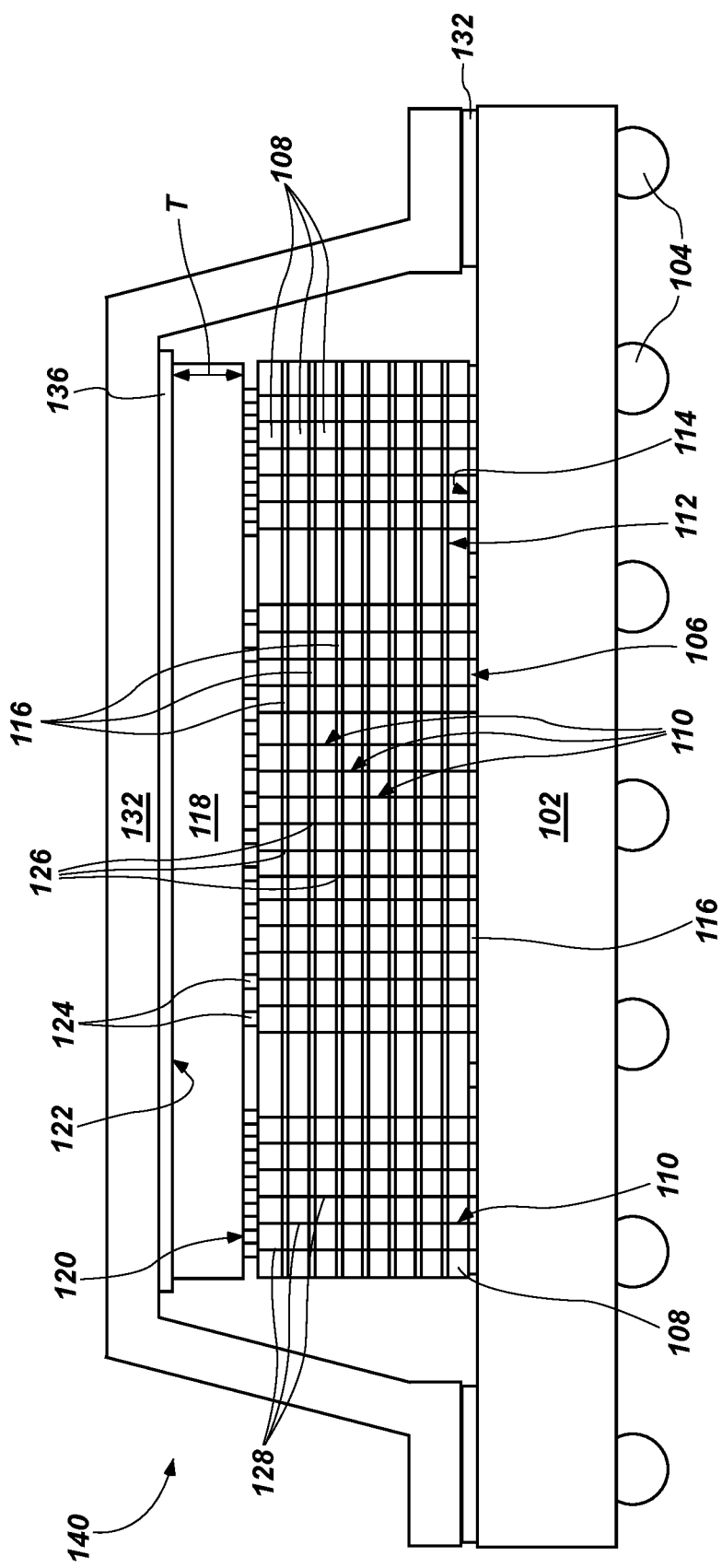
FIG. 4 is a cross-sectional view of another embodiment of a semiconductor device package.

FIG. 4 is a cross-sectional view of another embodiment of a semiconductor device package 140. The semiconductor device package 140 of FIG. 4 may be generally similar to the semiconductor device package 100 of FIG. 1, with specific differences described as follows. In some embodiments, the semiconductor device package 140 may lack any interposer 130 (see FIG. 1) for directly electrically connecting the other semiconductor die 118 to the substrate 102. For example, the electrical connectors 128 may extend through portions of the semiconductor dice 108 in the stack between the other semiconductor die 118 and the substrate 102. More specifically, the electrical connectors 128 may extend, for example, through portions of the semiconductor dice 108 in the stack between the other semiconductor die 118 and the substrate 102 located laterally adjacent to the vias 110 and unconnected to integrated circuitry of the semiconductor dice 108. As a specific, nonlimiting example, the electrical connectors 128 may extend through the semiconductor dice 108 in the stack between the other semiconductor die 118 and the substrate 102 at the peripheries thereof in portions lacking integrated circuitry. In such embodiments, a surface area of the active surface 120 of the other semiconductor die 118 may be at least substantially equal to a surface area of the active surface 112 of each other semiconductor die 108 in the stack. Stated another way, the semiconductor dice 108 of the stack may be of substantially the same length and width as a length and width of the other semiconductor die 118, and the sides of all the dice 108 and 118 may be vertically aligned.

Figure 5:
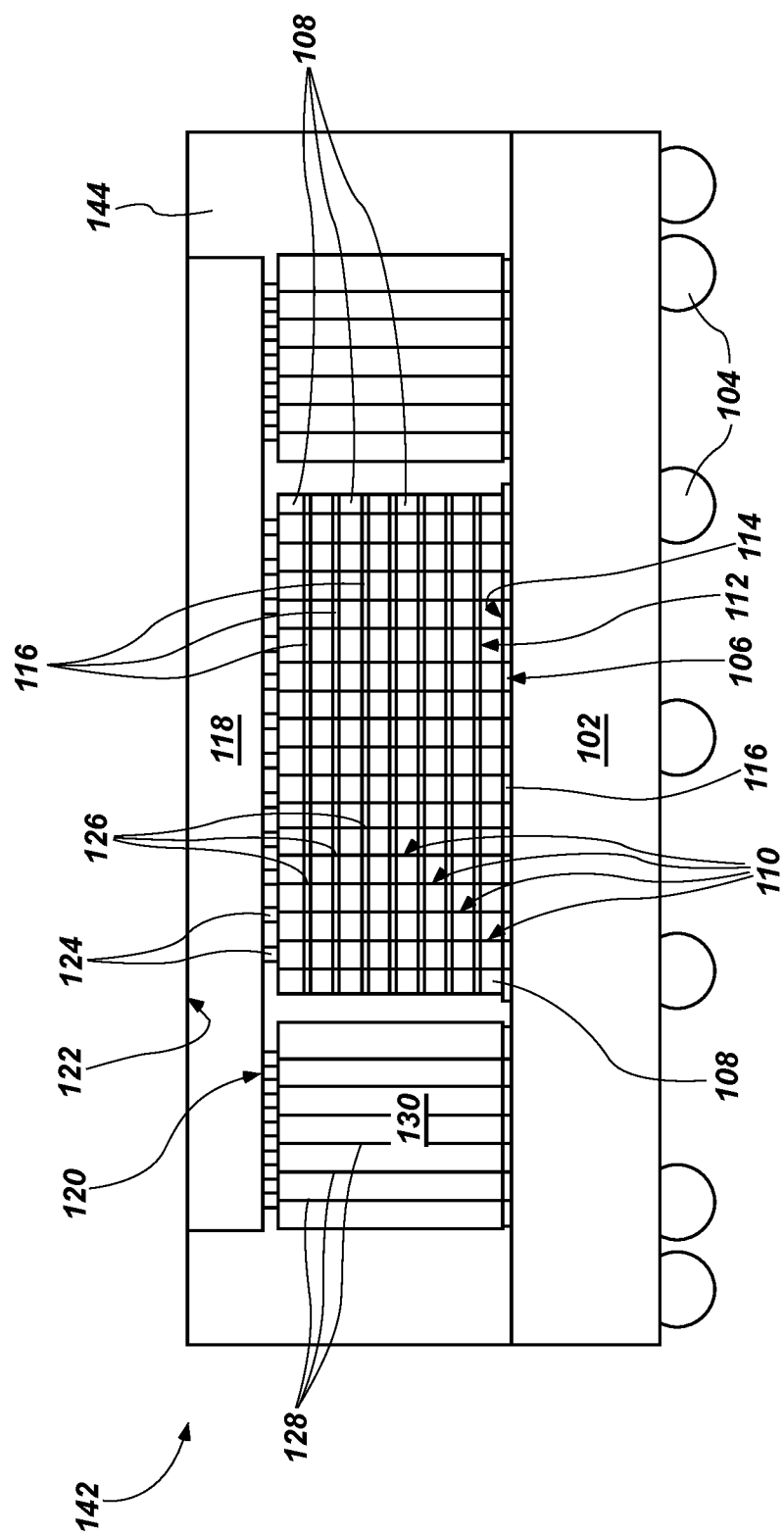
FIG. 5 is a cross-sectional view of still another embodiment of a semiconductor device package.

FIG. 5 is a cross-sectional view of still another embodiment of a semiconductor device package 142. The semiconductor device package 142 of FIG. 5 may be generally similar to the semiconductor device package 100 of FIG. 1, with specific differences described as follows. In some embodiments, the semiconductor device package 142 may lack any heat spreader 132 (see FIG. 1) and TIM 136 (see FIG. 1). For example, the inactive surface 122 of the other semiconductor die 118 may be exposed to the environment (e.g., to the air) on a side of the other semiconductor die 118 opposing the substrate 102. More specifically, the inactive surface 122 of the other semiconductor die 118 may at least partially define a topmost surface of the semiconductor device package 142.

In some embodiments, an encapsulation material 144 may at least partially surround a periphery of the other semiconductor die 118. For example, encapsulation material 144 may extend around the periphery of the other semiconductor die 118, but may not extend onto the inactive surface 122 of the other semiconductor die 118. More specifically, the encapsulation material 144 may, for example, surround the periphery of the other semiconductor die 118 and be flush with the inactive surface 122 of the other semiconductor die 118.

In some embodiments, the encapsulation material 144 may also at least partially surround other components of the semiconductor device package 142. For example, the encapsulation material 144 may at least partially surround each interposer 130, the stack of semiconductor dice 108 between the other semiconductor die 118 and the substrate 102, and the electrical conductors 124 electrically connecting the other semiconductor die 118 to each interposer 130. In some embodiments, the encapsulation material 144 may be dispensed, as by molding, in a single application and comprise an electrically insulating and thermally conductive material (e.g., exhibiting a thermal conductivity of about 0.5 W/m·K, 1 W/m·K, 1.5 W/m·K, 2 W/m·K, 2.5 W/m·K, 3 W/m·K or more, or in any range defined by such thermal conductivities). Suitable encapsulation materials 144 are commercially available, for example, from Sumitomo Plastics America, Inc. of Santa Clara, Calif.

The semiconductor device package 142 may include one or more interposers 130 located between the other semiconductor die 118 and the substrate 102 laterally adjacent to the semiconductor dice 108 in the stack between the other semiconductor die 118 and the substrate 102. The interposer 130 may include one or more electrical connectors 128 extending through the interposer 130 and directly electrically connecting the active surface 120 of the other semiconductor die 118 to the substrate 102. For example, the interposer 130 may exhibit any of the configurations described previously in connection with FIGS. 1 through 3.

The semiconductor device package 142 may be assembled from the substrate 102 upward at the wafer or other bulk substrate level and then singulated to form the semiconductor device package 142 in some embodiments. For example, the stack of semiconductor dice 108 may be positioned on, and electrically connected to, a wafer including the substrate 102 utilizing the vias 110. The underfill material 116 may be positioned between each adjacent pair of semiconductor dice 108 and 118 one layer at a time, or in one step after the stack of the first semiconductor die 108 and the additional semiconductor dice 118 has been completed. Each interposer 130 may be positioned laterally adjacent to the stack of semiconductor dice 108 on the substrate 102, and may be electrically connected to the substrate 102. The other semiconductor die 118 may be positioned over, and electrically connected to, the electrical connectors 128 of each interposer 130 and the stack of semiconductor dice 108 with the active surface 120 of the other semiconductor die 118 facing the substrate 102. An encapsulation material 144 may be dispensed over the wafer including the substrate 102 and around the stack of semiconductor dice 108, each interposer 130, and the periphery of the other semiconductor die 118. The inactive surface 122 of the other semiconductor die 118 may remain exposed to the environment. The semiconductor device package 142 may then be singulated from the wafer (e.g., by cutting a plurality of such semiconductor device packages 142 arranged in a grid from the wafer).

Figure 6:
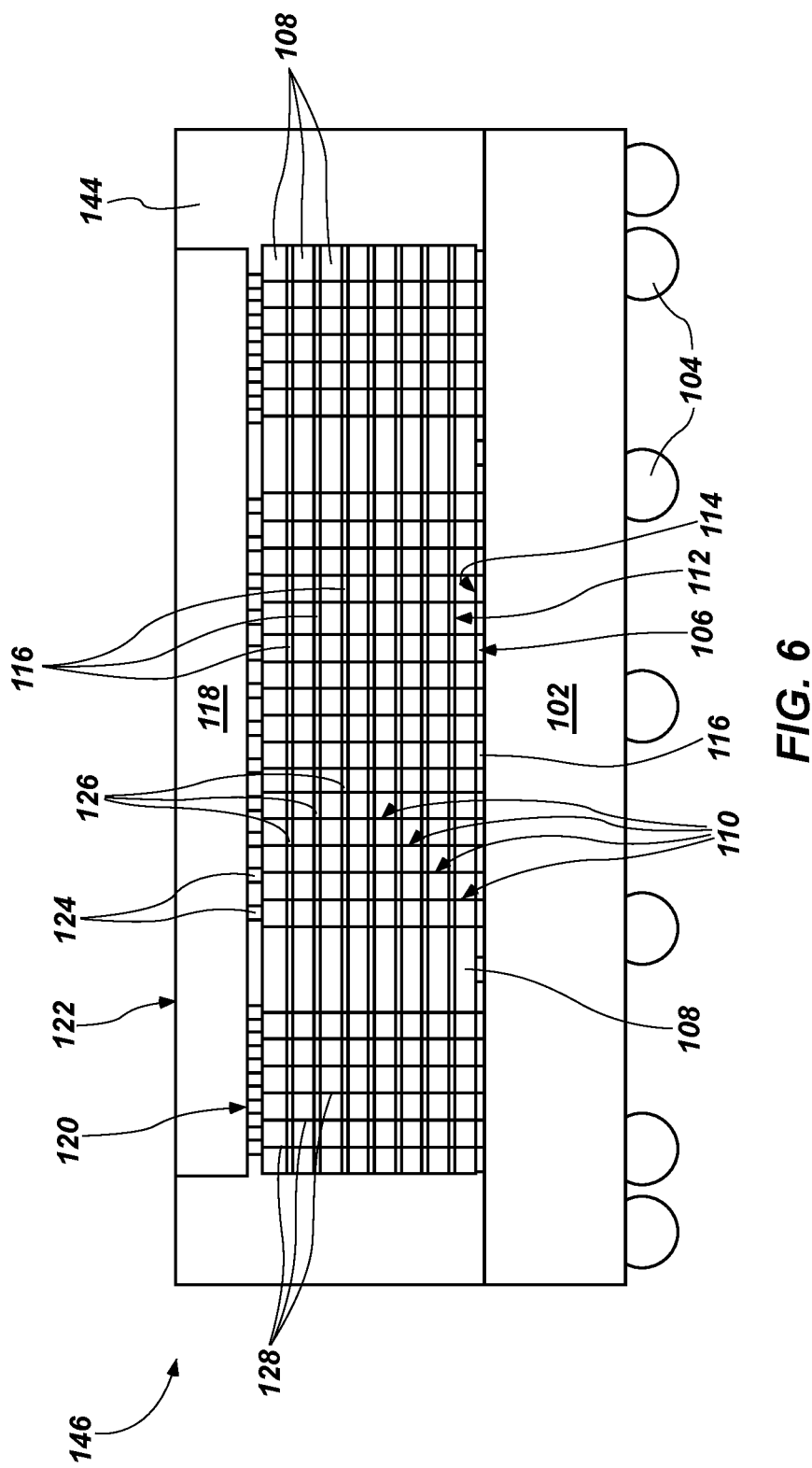
FIG. 6 is a cross-sectional view of yet another embodiment of a semiconductor device package.

FIG. 6 is a cross-sectional view of yet another embodiment of a semiconductor device package. The semiconductor device package 146 of FIG. 6 may be generally similar to the semiconductor device package 142 of FIG. 5, with specific differences described as follows. In some embodiments, the semiconductor device package 146 may lack any separate interposer 130 (see FIG. 5) for directly electrically connecting the other semiconductor die 118 to the substrate 102. For example, the electrical connectors 128 may extend through portions of the semiconductor dice 108 in the stack between the other semiconductor die 118 and the substrate 102. More specifically, the electrical connectors 128 may extend, for example, through portions of the semiconductor dice 108 in the stack between the other semiconductor die 118 and the substrate 102 located laterally adjacent to the vias 110. As a specific, nonlimiting example, the electrical connectors 128 may extend through the semiconductor dice 108 in the stack between the other semiconductor die 118 and the substrate 102 at the peripheries thereof in portions lacking integrated circuitry.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce other embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of making a semiconductor device package, comprising:
    attaching a stack of semiconductor dice to a substrate, an uppermost semiconductor die of the stack of semiconductor dice located on a side of the stack of semiconductor dice opposite the substrate and being a heat-generating component configured to generate more heat than each other semiconductor die of the stack of semiconductor dice;
    forming a direct electrical connection between the substrate and the uppermost semiconductor die in electrical isolation from integrated circuitry of the other semiconductor dice of the stack of semiconductor dice;
    placing a passivation material on a side of the uppermost semiconductor die opposite the substrate; and
    placing a heat sink over the passivation material.

2. The method of claim 1, further comprising refraining from thinning the uppermost semiconductor die from a wafer-level thickness as measured in a direction perpendicular to an active surface of the uppermost semiconductor die.

3. The method of claim 1, further comprising placing a thermal interface material over the passivation material before placing the heat sink.

4. The method of claim 3, wherein placing the thermal interface material over the passivation material comprises placing an electrically conductive thermal interface material over the passivation material.

5. The method of claim 1, wherein attaching the stack of semiconductor dice to the substrate comprises attaching a stack of semiconductor dice comprising vias extending through each semiconductor die other than the uppermost semiconductor die to the substrate, the vias electrically interconnected to one another and to the uppermost semiconductor die and the substrate.

6. The method of claim 5, wherein forming the direct electrical connection between the substrate and the uppermost semiconductor die comprises electrically connecting additional vias extending through each semiconductor die other than the uppermost semiconductor die to the substrate and the uppermost semiconductor die, the additional vias not being electrically connected to integrated circuitry of the semiconductor dice other than the uppermost semiconductor die.

7. The method of claim 5, wherein forming the direct electrical connection between the substrate and the uppermost semiconductor die comprises placing at least one interposer through which the direct electrical connection extends adjacent to the semiconductor dice other than the uppermost semiconductor die in the stack of semiconductor dice longitudinally between the substrate and the uppermost semiconductor die.

8. A semiconductor device package, comprising:
    a substrate;
    a stack of semiconductor dice attached to the substrate, an uppermost semiconductor die of the stack of semiconductor dice located on a side of the stack of semiconductor dice opposite the substrate being a heat-generating component configured to generate more heat than each other semiconductor die of the stack of semiconductor dice;
    electrical connectors extending directly from the uppermost semiconductor die to the substrate;
    a heat sink located on a side of the uppermost semiconductor die opposite the substrate; and
    a passivation material located between the uppermost semiconductor die and the heat sink.

9. The semiconductor device package of claim 8, wherein each other semiconductor die in the stack of semiconductor dice between the substrate and the uppermost semiconductor die comprises a memory die and the uppermost semiconductor die comprises a logic die.

10. The semiconductor device package of claim 8, wherein a thickness of the uppermost semiconductor die as measured in a direction perpendicular to an active surface of the uppermost semiconductor die is about 200 µm or greater.

11. The semiconductor device package of claim 8, wherein the uppermost semiconductor die is free of vias.

12. The semiconductor device package of claim 8, further comprising a thermal interface material located between the passivation material and the heat sink.

13. The semiconductor device package of claim 12, wherein the thermal interface material is electrically conductive.

14. The semiconductor device package of claim 8, wherein the substrate and the uppermost semiconductor die are larger in at least one lateral dimension than other semiconductor dice in the stack of semiconductor dice, and the electrical connectors extend through at least one interposer located laterally adjacent to the other semiconductor dice between at least one portion of each of the substrate and the uppermost semiconductor die.

15. The semiconductor device package of claim 14, wherein the at least one interposer is located peripherally adjacent to the other semiconductor dice between the substrate and the uppermost semiconductor die and further comprising at least another interposer located peripherally adjacent to the other semiconductor dice between the substrate and the uppermost semiconductor die on a side of the stack opposite the at least one interposer, the at least another interposer comprising additional electrical connectors forming another direct electrical connection between the substrate and the uppermost semiconductor die.

16. The semiconductor device package of claim 14, wherein the substrate and the uppermost semiconductor die are larger in each lateral dimension than each corresponding lateral dimension of the other semiconductor dice in the stack of semiconductor dice and wherein the at least one interposer peripherally surrounds the other semiconductor dice between the substrate and the uppermost semiconductor die.

17. The semiconductor device package of claim 8, further comprising vias extending through each semiconductor die of the stack of semiconductor dice, the vias electrically interconnecting the semiconductor dice in the stack to one another and to the substrate.

18. The semiconductor device package of claim 17, wherein the electrical connectors are located laterally adjacent to the vias.

19. The semiconductor device package of claim 18, wherein the electrical connectors extend longitudinally through portions of the semiconductor dice in the stack of semiconductor dice between the substrate and the uppermost semiconductor die.

20. The semiconductor device package of claim 19, wherein a size and shape of the uppermost semiconductor die is at least substantially equal to a size and shape of each other semiconductor die in the stack of semiconductor dice.

* * * * *